United States Patent [19]

Maitland

[11] 4,049,980
[45] Sept. 20, 1977

[54] IGFET THRESHOLD VOLTAGE COMPENSATOR

[75] Inventor: David Steven Maitland, Loveland, Colo.

[73] Assignee: Hewlett-Packard Company, Palo Alto, Calif.

[21] Appl. No.: 680,617

[22] Filed: Apr. 26, 1976

[51] Int. Cl.² .................... H03K 1/02; H03K 3/353
[52] U.S. Cl. .................................... 307/304; 307/297
[58] Field of Search ............ 307/297, 304; 330/35; 323/22 R, 3, 4

[56] References Cited

U.S. PATENT DOCUMENTS

| | | | |
|---|---|---|---|
| 3,609,414 | 9/1971 | Pleshko et al. | 307/304 X |
| 3,806,741 | 4/1974 | Smith | 307/304 |

OTHER PUBLICATIONS

Chang, "FET N-Channel Threshold Voltage-Control Circuit;" *IBM Tech. Discl. Bull.;* vol. 17, No. 1, p. 140, June 1974.

Pleshko et al.; "MOS Transistor Electronic Stabilization of Thresholds;" *IBM Tech. Discl. Bull.;* vol. 10, No. 3, pp. 336–337; Aug. 1967.

Hummel, "Sentry Circuit for Substrate Voltage Control;" *IBM Tech. Discl. Bull.;* vol. 15, No. 2, pp. 478–479; July 1972.

Primary Examiner—Stanley D. Miller, Jr.
Assistant Examiner—Larry N. Anagnos
Attorney, Agent, or Firm—William E. Hein; Michael L. Sherrard

[57] ABSTRACT

A circuit is described which compensates for variation in the threshold voltage of Insulated Gate Field Effect Transistors (IGFETs) in an integrated circuit by modulating the substrate voltage in response to the variation of the threshold voltage from a desired nominal value.

9 Claims, 8 Drawing Figures

IGFET THRESHOLD VOLTAGE COMPENSATOR

BACKGROUND AND SUMMARY OF THE INVENTION

Many process parameters in the manufacture of an IGFET can result in variations in the threshold voltage, $V_{th}$. The threshold voltage, $V_{th}$, characterizes the voltage at which conduction between the source and the drain (inversion) is abruptly enhanced. In effect, this is the gate voltage required to neutralize the immobile charge above and below the channel region so that any further increase in gate voltage mobilizes minority carriers in the channel region. A more thorough analysis of $V_{th}$ is given in *MOSFET IN CIRCUIT DESIGN* by Robert H. Crawford, McGraw-Hill Book Company, 1967, pages 21-26 and pages 37-40.

In our experience, variations in $V_{th}$ are typically less than 1.5 volts between wafers. This variation has undesirable effects upon the design of IGFET integrated circuits since the circuits must be designed to operate for the entire range of $V_{th}$. Circuits designed to accommodate a large variation in $V_{th}$ are characterized by high power consumption, wasted area and high current densities.

Accordingly, the principal object of the present invention is to bias the substrate voltage, $V_{BG}$, in response to a variation in $V_{th}$ such that $V_{BG}$ becomes more negative as the intrinsic ($V_{BG}=0$) $V_{th}$ decreases. A further object of the present invention is to reduce the variation in $V_{th}$ due to process parameters in the manufacture of IGFETs and thereby permit the design of more optimized IGFET integrated circuits. Another object of the present invention is to improve the long term stability of IGFET integrated circuits by reducing threshold voltage shift due to aging. Other and incidental objects of the present invention will become apparent from a study of the following detailed description.

These objects are accomplished in accordance with the preferred embodiment of the invention by sensing the threshold voltage of an IGFET and regulating a voltage divider circuit to adjust the voltage of the substrate relative to ground. Varying the substrate voltage, also known as a backgate voltage, $V_{BG}$, varies the threshold voltage as described by Crawford, supra, pages 40-45. By appropriate circuit design, a large range of threshold voltages can be compensated to a near nominal value.

DESCRIPTION OF THE PREFERRED EMBODIMENT

Figure 1:
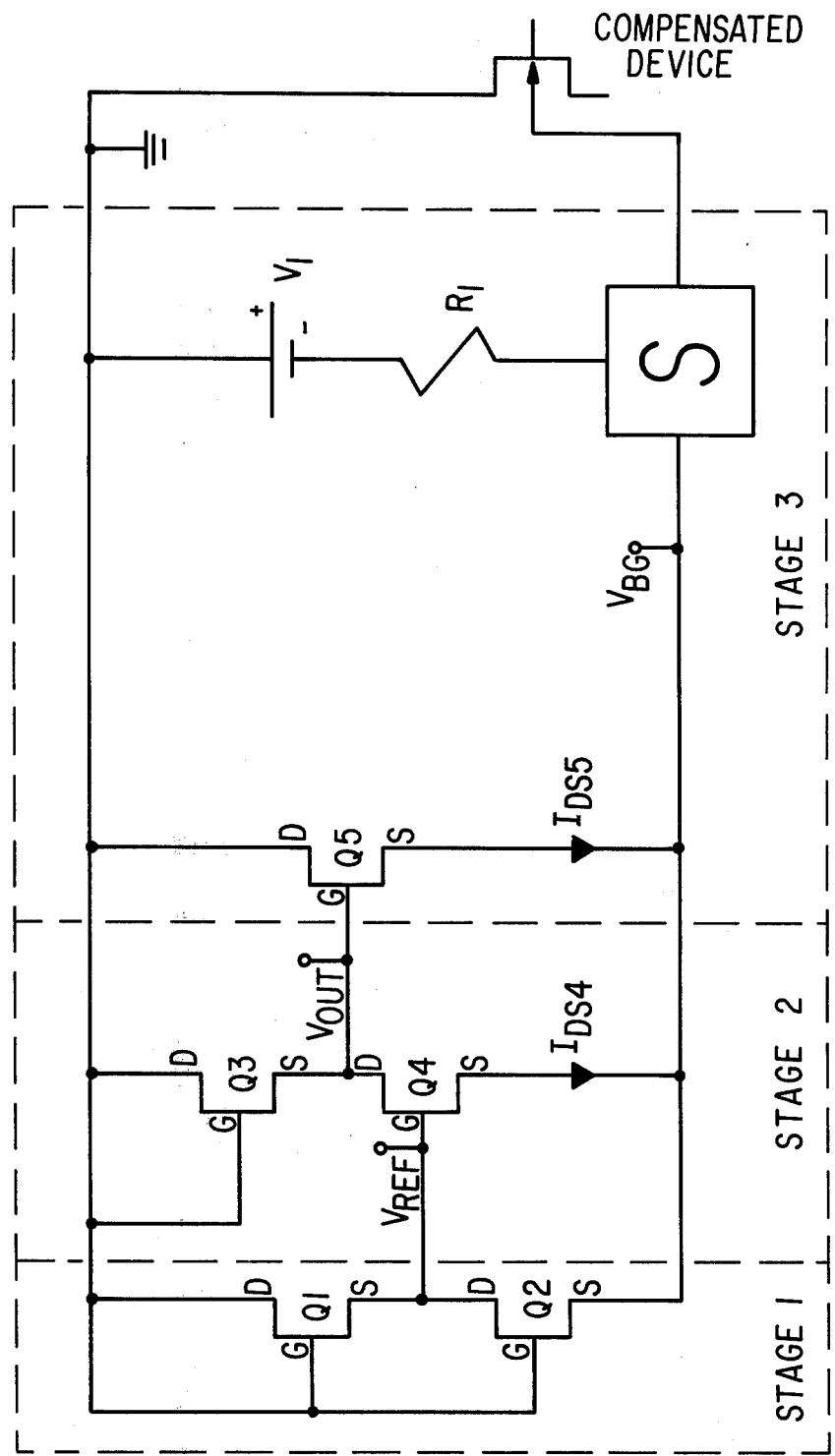
FIG. 1 is a detailed schematic diagram of the preferred embodiment of the IGFET Threshold Voltage Compensator.

The preferred embodiment of the IGFET Threshold Voltage Compensator, implemented on a substrate common to the devices which it is designed to compensate, is shown in FIG. 1. To aid in its explanation, certain stages of the IGFET Threshold Voltage Compensator have been defined and certain engineering approximations have been made.

Referring to FIG. 1, stage 1 acts as a voltage source and supplies a reference voltage, $V_{REF}$, to stage 2. Stage 2 senses the threshold voltage, $V_{th}$, and applies a voltage, $V_{OUT}$, responsive to the threshold voltage, to stage 3. Stage 3 regulates the current through a resistor in response to $V_{OUT}$ and biases the substrate voltage, $V_{BG}$, thereby compensating for variations in the threshold voltage $V_{th}$.

Stage 1 is constructed such that the reference voltage, $V_{REF}$, applied to stage 2 is such that the quantity $(V_{GS}-V_{th})$ is slightly positive for Q4 (the channel of IGFET Q4 is slightly inverted). This will increase the sensitivity of the threshold voltage sensing stage, stage 2, as discussed below.

Stage 2 senses the threshold voltage, $V_{th}$, of transistor Q4. Transistors Q3 and Q4 operate in the saturation region, characterized by:

$$I_{DS} = \beta/2 \, (V_{GS} - V_{th})^2,$$

where $I_{DS}$ is the drain to source current, $\beta$ is a function of the transistor's width and length, and $V_{GS}$ is the gate to source voltage. The beta ratio $(\beta_4/\beta_3)$ is greater than one. The large $\beta$ of transistor Q4 and the small absolute value of $(V_{GS} - V_{th})$ resulting from the appropriate selection of $V_{REF}$, described above, makes the current, $I_{DS4}$, through transistor Q4 highly sensitive to variations in the threshold voltage, $V_{th}$, of transistor Q4. An increase in the threshold voltage, $V_{th}$, of the transistor Q4 will produce a decrease in the current $I_{DS4}$. Approximating transistor Q3 as a resistor, a decrease in $I_{DS4}$ results in an increase in $V_{OUT}$.

Stage 3 comprises a voltage divider and a voltage source. Transistor Q5 is operated as a source-follower such that the back-gate voltage, $V_{BG}$, follows changes in $V_{OUT}$, i.e., transistor Q5 draws current through resistor $R_1$ to keep $(V_{OUT} - V_{BG})$ approximately constant. An increase in $V_{OUT}$ will draw more current through resistor $R_1$, and increase the back-gate voltage $V_{BG}$.

In summary, an increase in $V_{th}$ causes a decrease in $I_{DS4}$, an increase in $V_{OUT}$, an increase in $I_{DS5}$, and an increase in $V_{BG}$ ($V_{th} \uparrow$, $I_{DS4} \downarrow$, $V_{OUT} \uparrow$, $I_{DS5} \uparrow$, $V_{BG} \uparrow$). An increase in $V_{BG}$ results in the desired decrease in $V_{th}$ as shown by the relation:

$$V_{th} = -K_1 \pm (\phi_S + V_{BG})^{1/2} + V_{SS} \text{ (Crawford, supra, p. 41)},$$

where the quantity $\pm (\phi_S + V_{BG})$ is defined to be positive.

Figure 2:
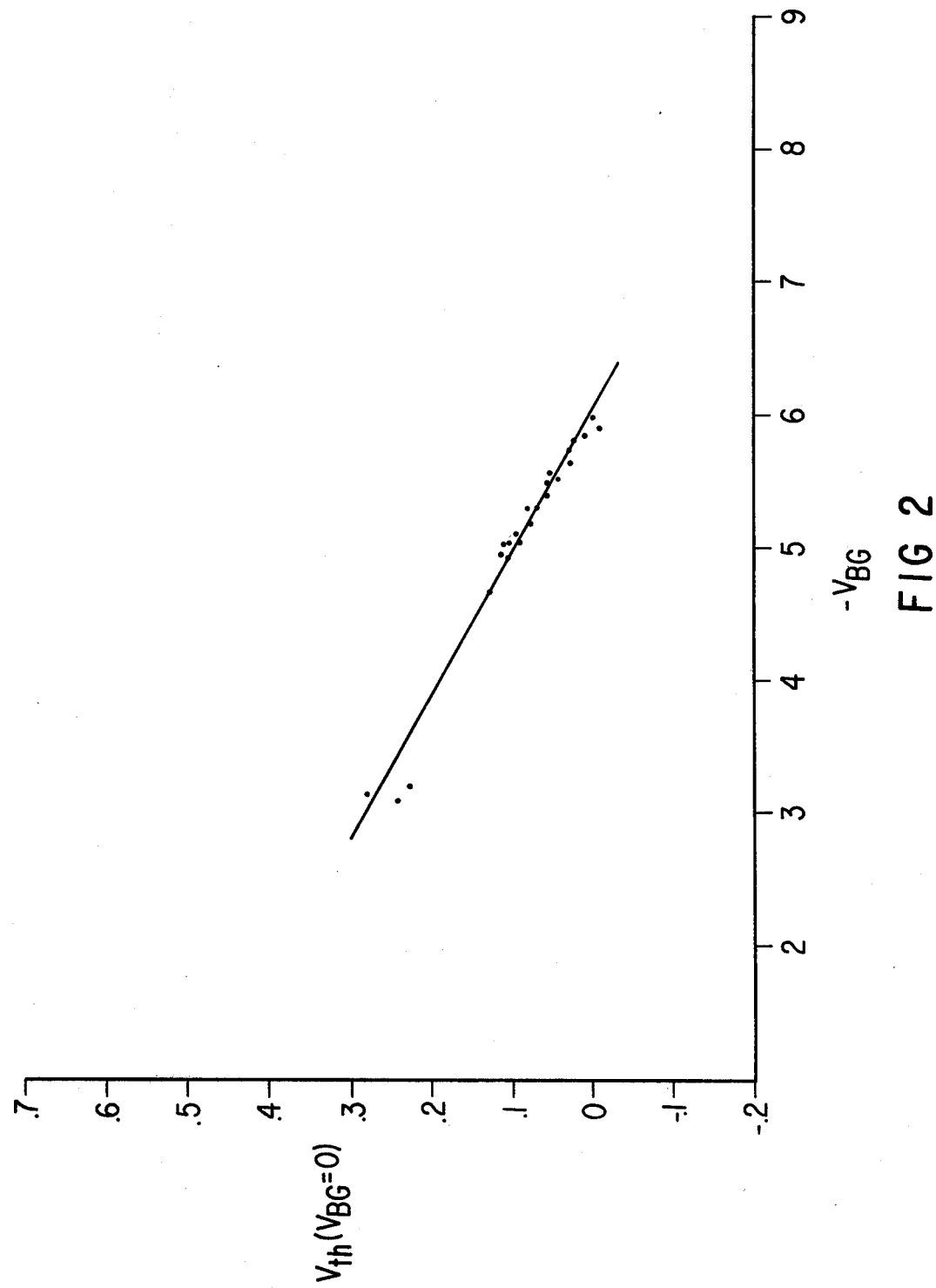
FIG. 2 is a graph showing a typical characteristic of the preferred embodiment. The substrate voltage, $V_{BG}$, is given as a function of the intrinsic threshold voltage, $V_{th}(V_{BG}=0)$.

FIG. 2 shows a typical characteristic of the preferred embodiment and illustrates a useful range over which the variation of $V_{BG}$ with $V_{th}$ is nearly linear. For a given intrinsic ($V_{BG} = 0$) threshold voltage, $V_{th}$, the compensator will regulate the substrate voltage, $V_{BG}$, as illustrated. An increase in $V_{th}$ results in an increase (less negative) in $V_{BG}$. The choice of component values determines the useful linear range of the circuit and the slope of the characteristic.

Figure 3:
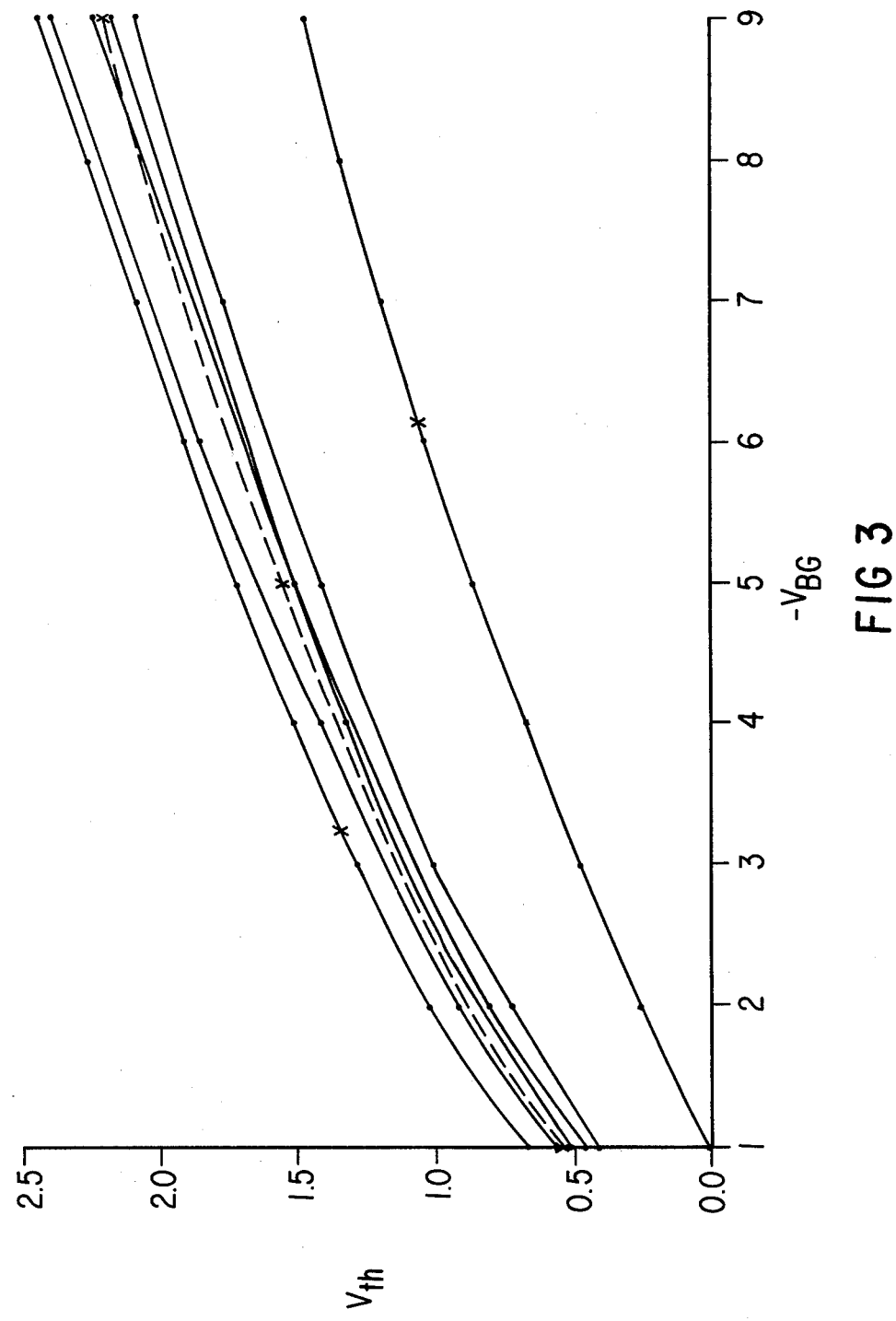
FIG. 3 is a graph showing threshold voltage, $V_{th}$, as a function of the substrate voltage, $V_{BG}$, for typical wafers.
Figure 4A:
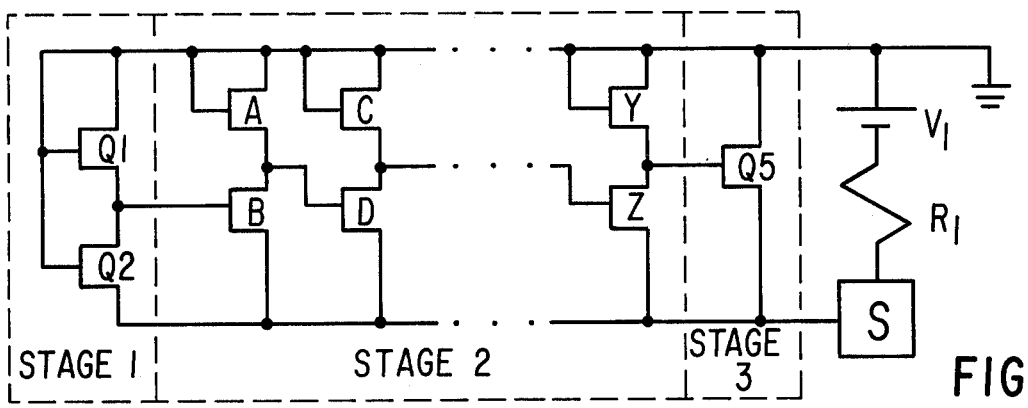
FIGS. 4 (A-E) show a variety of detailed schematic diagrams for alternative embodiments of the claimed invention.
Figure 4B:
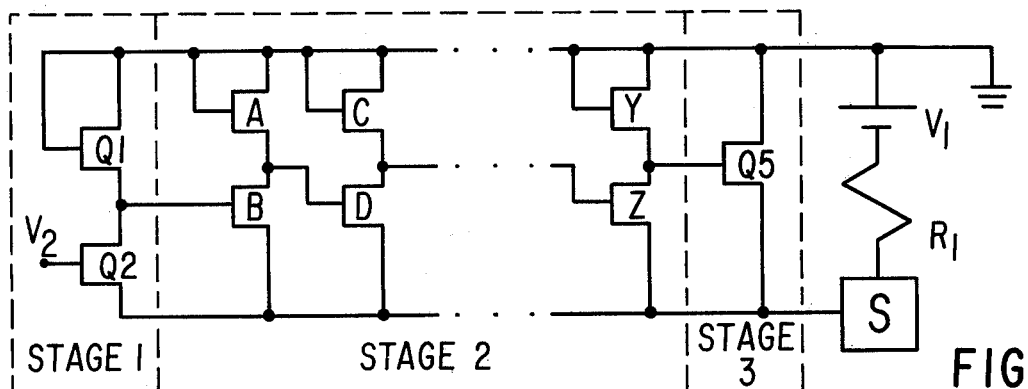
Figure 4C:
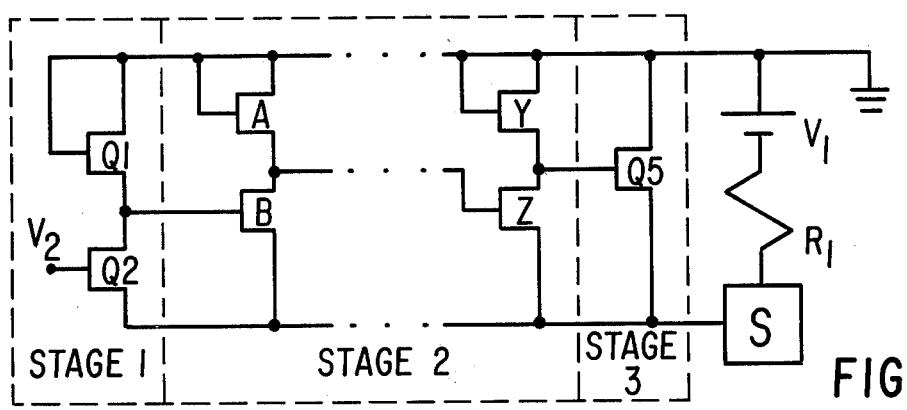
Figure 4D:
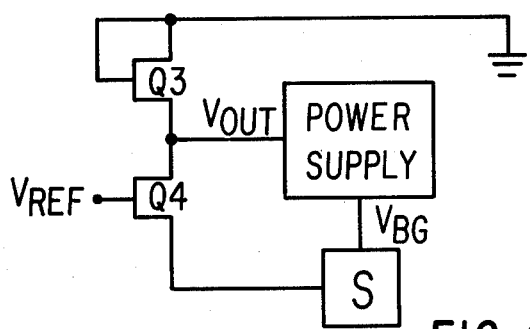
Figure 4E:
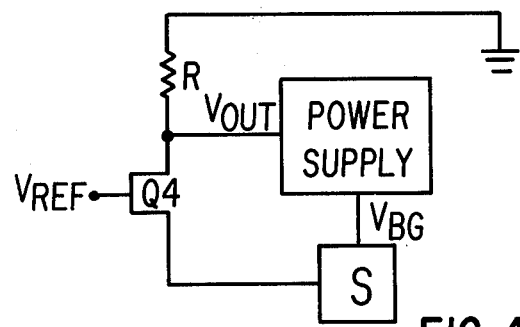

FIG. 3 illustrates the threshold voltage as a function of $V_{BG}$ for IGFETs in typical wafers. A large intrinsic ($V_{BG}=0$) threshold voltage $V_{th}$, corresponding to a higher curve on FIG. 3, results in an increased $V_{BG}$ ($V_{BG}$ becomes less negative) as was shown in FIG. 2, described above. The increased $V_{BG}$ reduces the circuit (compensated) threshold voltage as desired, as shown in FIG. 3.

The present invention is useful in integrated circuits where the assumption can be made that the $V_{th}$ of all the IGFETs in a single wafer are similar, but vary due to process parameters from a desired $V_{th}$. The present invention allows circuit design to assume a much smaller tolerance in the variation in $V_{th}$, $\Delta V_{th}$.

Alternative embodiments of the present invention include such circuit variations as shown in FIG. 4. Circuit 4A operates as described above except that an even number of inverting amplifiers are inserted between stages 2 and 3. Circuit 4B operates with transistor Q2 in the saturation region. Circuit 4C operates as above except that the component values are chosen to cause $V_{OUT}$ to decrease when $V_{th}$ increases and an odd number of inverting amplifiers are inserted between stages 2 and 3. Circuit 4D is similar to the preferred embodiment of the present invention except that stage 3 has been replaced by a power supply responsive to the $V_{th}$ sensor and implemented such that it directly regulates the substrate voltage $V_{BG}$. Circuit 4E is similar to the circuit shown in 4D except that transistor Q3 has been replaced by a resistor R.

A person skilled in the art will realize that the above description and approximations do not rigorously describe the circuit operation. The circuit cannot be broken into stages and rigorously modeled as a classical feedback loop because the $V_{th}$ sensing, the $V_{BG}$ regulation, and the $V_{BG}$ feedback are distributed throughout the circuit and not completely restricted to the various stages as approximated in the above description. For example, in practice, stage 1 produces a reference voltage, $V_{REF}$, which varies as a function of $V_{th}$ and $V_{BG}$ so as to keep the quantity ($V_{GS} - V_{th}$) small. Rigorous analysis of the circuit requires that the circuit be molded in its entirety. The component values of the preferred embodiment were initially determined from iterative numerical analysis.

I claim:

1. A circuit for compensating for variation in the threshold voltage of IGFETs with a common substrate in an integrated circuit, the circuit comprising:
    a reference voltage source with first and second terminals;
    a first resistive element serially coupled to
    a first IGFET with a gate coupled to the first terminal of said reference voltage source, the serial combination of said first resistive element and said first IGFET being coupled between the second terminal of said reference voltage source and the substrate; and
    means for applying a bias voltage to the substrate, said means responsive to a voltage at the couple between said first resistive element and said first IGFET for adjusting the bias voltage to maintain the threshold voltage of the IGFETs in the integrated circuit at desired threshold voltage.

2. A circuit for compensating for variation in the threshold voltage of IGFETs in an integrated circuit as in claim 1, wherein said first resistive element comprises:
    a second IGFET with a gate held at a fixed voltage.

3. A circuit for compensating for variation in the threshold voltage of IGFETs in an integrated circuit as in claim 1, wherein said reference voltage source further comprises:
    means for supplying said reference voltage to the gate of said first IGFET such that the channel of said first IGFET is inverted.

4. A circuit for compensating for variations in the threshold voltages of IGFETs in an integrated circuit, as in claim 1, wherein the means for sensing the threshold voltage of an IGFET in an integrated circuit further comprises:
    means for amplifying the voltage of the drain of the first IGFET.

5. A circuit for compensating for variation in the threshold voltage of IGFETs with a common substrate in an integrated circuit, the circuit commprising:
    a first resistive element serially coupled to
    a first IGFET, the serial combination of said first resistive element and said first IGFET being coupled between the substrate and a ground;
    a second resistive element serially coupled to
    a second IGFET with a gate grounded, the serial combination of said second resistive element and said second IGFET being coupled between the substrate and the ground, and the connection between said second resistive element and said second IGFET coupled to the gate of said first IGFET;
    means for applying a bias voltage to the substrate, said means responsive to a voltage at the couple between said first resistive element and said first IGFET for adjusting the bias voltage to maintain the threshold voltage of the IGFETs in the integrated circuit at a desired threshold voltage.

6. A circuit for compensating for variation in the threshold voltage of IGFETs in an integrated circuit as in claim 5, wherein said first and second resistive elements comprise:
    IGFETs with gates held at fixed voltages.

7. A circuit for compensating for variation in the threshold voltage of IGFETs with a common substrate in an integrated circuit, the circuit comprising:
    a first resistive element serially coupled to
    a first IGFET with a gate coupled to ground, the serial combination of said first resistive element and said first IGFET being coupled between the substrate and the ground; and
    means for applying a bias voltage to the substrate, said means responsive to a voltage at the couple between said first resistive element and said first IGFET for adjusting the bias voltage to maintain the threshold voltage of the IGFETs in the integrated circuit at a desired threshold voltage.

8. A circuit for compensating for variation in the threshold voltage of IGFETs with a common substrate in an integrated circuit, the circuit comprising:
    a voltage source with first and second terminals;
    a resistor coupled between the first terminal of said voltage source and the substrate;
    a first IGFET coupled between the substrate and the second terminal of said voltage source;
    second and third IGFETs, with gates coupled to the second terminal of said voltage source, said IGFETs being serially coupled between the substrate and the second terminal of said voltage source;
    fourth and fifth IGFETs serially coupled between substrate and the second terminal of said voltage source, the gate of said fourth IGFET being coupled to the second terminal of said voltage source, the gate of said fifth IGFET being coupled to the connection between said second and third IGFETs, and the connection between said fourth and fifth IGFETs being coupled to the gate of said first IGFET.

9. A circuit as in claim 8 wherein said first and fourth IGFETs operate in the triode region.

* * * * *

UNITED STATES PATENT AND TRADEMARK OFFICE
CERTIFICATE OF CORRECTION

PATENT NO. : 4,049,980
DATED : September 20, 1977
INVENTOR(S) : David Steven Maitland It is certified that error appears in the above–identified patent and that said Letters Patent are hereby corrected as shown below:

Column 3, line 37, "molded" should read --modeled--;

Column 4, line 12, "commprising" should read --comprising--.

Signed and Sealed this

Third Day of January 1978

[SEAL]

Attest:

RUTH C. MASON
*Attesting Officer*

LUTRELLE F. PARKER
*Acting Commissioner of Patents and Trademarks*